(12) United States Patent
Ueyama

(10) Patent No.: US 7,415,362 B2
(45) Date of Patent: Aug. 19, 2008

(54) IMAGE DEFECT INSPECTION APPARATUS

(75) Inventor: Shinjii Ueyama, Tokyo (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 11/780,428

(22) Filed: Jul. 19, 2007

(65) Prior Publication Data

US 2008/0030200 A1 Feb. 7, 2008

(30) Foreign Application Priority Data

Aug. 2, 2006 (JP) ............... 2006-210932

(51) Int. Cl.
*G01B 5/28* (2006.01)
*G06K 9/00* (2006.01)

(52) U.S. Cl. ..................... 702/35; 382/145

(58) Field of Classification Search ........... 702/34, 702/35, 83, 150, 155, 183; 356/237, 431; 382/144, 145, 149

See application file for complete search history.

(56) References Cited

U.S. PATENT DOCUMENTS 7,275,006 B2 * 9/2007 Tsuji et al. ............... 702/81
2004/0228515 A1 * 11/2004 Okabe et al. .............. 382/145
2006/0215902 A1 * 9/2006 Shibuya et al. ............ 382/149

FOREIGN PATENT DOCUMENTS

| JP | 2004-177397 | 6/2004 |
|---|---|---|
| JP | 2004-273850 | 9/2004 |
| JP | 2005-134976 | 5/2005 |

OTHER PUBLICATIONS

Patent Abstracts of Japan, Publication No. 2004177397 A; Date of Publication: Jun. 24, 2004; in the name of Akio Ishikawa.
Patent Abstracts of Japan, Publication No. 2004273850 A; Date of Publication: Sep. 30, 2004; in the name of Naoya Takeuchi.
Patent Abstracts of Japan, Publication No. 2005134976 A; Date of Publication: May 26, 2005; in the name of Yoshiyuki Momiyama et al.

* cited by examiner

Primary Examiner—Bryan Bui
(74) Attorney, Agent, or Firm—Christie, Parker & Hale, LLP

(57) ABSTRACT

An image defect inspection apparatus which performs a defect detection for detecting a defect on a surface of a sample by comparing corresponding portions in a captured image of the surface of the sample. The apparatus includes a plurality of processor elements which perform the defect detection in parallel on regions created by dividing the captured image; and a processor unit, which receives defect information in parallel from the plurality of processor elements as information concerning individual defects detected by the processor elements, and outputs the defect information as a set of defect information. Each individual one of the processor elements performs a reexamination on the defect detected by the individual processor element, before sending the defect information to the processor unit.

7 Claims, 11 Drawing Sheets

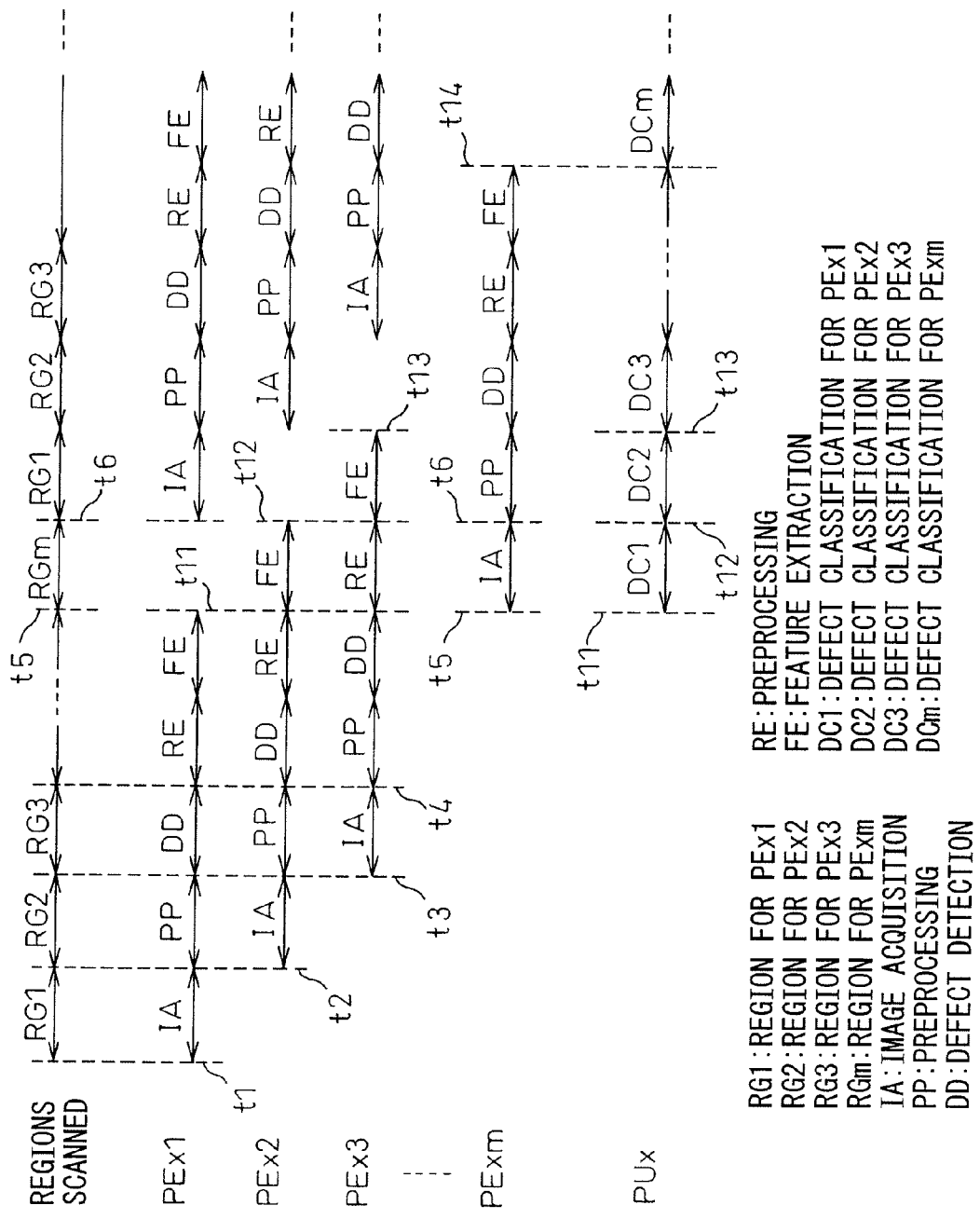

IMAGE DEFECT INSPECTION APPARATUS

CROSS REFERENCE TO RELATED APPLICATION

This application is based upon and claims the benefit of priority from the prior Japanese Patent Application No. 2006-210932, filed on Aug. 2, 2006, the entire contents of which are incorporated herein by reference.

BACKGROUND OF THE INVENTION

1. Field of the Invention

The present invention relates to an image defect inspection apparatus for detecting a defect on the surface of a sample based on a captured image of the surface of the sample, and more particularly to an image defect inspection apparatus which acquires a plurality of patterns by scanning a sample under inspection, such as a semiconductor wafer, a photomask substrate, a liquid crystal display panel substrate, or a liquid crystal device substrate, on which a plurality of patterns that should be identical to each other are formed in an orderly repeating fashion, and compares the corresponding portions of the patterns.

2. Description of the Related Art

A number of identical chips (dies) are formed in an orderly repeating fashion on a semiconductor wafer. In the semiconductor device fabrication process, inspection is performed in the middle or at the end of the process to check the formed dies for defects, and if any defect is detected, the defect information is immediately fed back to the fabrication process thereby improving the fabrication yield. For this purpose, image defect inspection is performed by capturing optical patterns of the dies and detecting the presence or absence of defects in the patterns.

To obtain a high-resolution image, the image of a semiconductor wafer is projected onto a one-dimensional image sensor, and the semiconductor wafer scanned by the one-dimensional image sensor by moving one relative to the other, thus forming the image of the semiconductor wafer. FIG. 1 is a diagram showing an example of a scan path for acquiring an image of a semiconductor wafer 100 on which a plurality of dies 101 are formed in an orderly repeating fashion.

As shown in FIG. 1, a number of semiconductor chips (dies) 110 are formed in an orderly repeating fashion on the semiconductor wafer 100, and the image of the entire surface of the semiconductor wafer 100 is acquired by scanning the surface along the scan path 102. In the scan path shown here, first the lower portions of the dies in a given row are scanned from left to right, and then the upper portions of the dies in the same row are scanned from right to left, but as a variant, after the lower portions of the dies in a given row are scanned from left to right, the lower portions of the dies in the next row may be scanned from right to left.

FIG. 2 is a diagram explaining the scanning operation in further detail. In the example shown, the image of the dies 101 in each row is acquired by four scans 102-1 to 102-4. The image obtained by one scan is a long and narrow strip-like image called a "swath image" which has a width W corresponding to the length of the light-sensitive area of the one-dimensional image sensor used for the image formation. In the illustrated example, a swath image SW1 is obtained by the scan 102-1, and a swath image SW2 by the scan 102-2.

When the sample under inspection is an array of memory dies, each die 101 has a peripheral circuit portion 111 and a cell portion 112, as shown in the figure. The peripheral circuit portion 111 contains randomly arranged patterns, while the cell portion 112 is made up of identical cell patterns repeated at a prescribed pitch.

FIGS. 3A and 3B are diagrams explaining a method of defect inspection when identical patterns are arranged in an orderly repeating fashion as described above. A method for making a comparison of corresponding patterns between two dies is called a single detection. In a single detection, if the patterns of the two dies do not match, there is a defect in either one of the dies, however there is no way of telling which die contains the defect.

Accordingly, as shown in FIG. 3A, each die is sequentially compared with the dies adjacent on both sides, one on each side, that is, a total of two comparisons are made for the same portion. This method is called a double detection. In a double detection, if the same portion of the die under inspection does not match the corresponding portions of the two adjacent dies, then it can be determined that the die under inspection contains the defect.

For example, when a comparison was made between the dies 101-1 and 101-2, as shown in FIG. 3A, a mismatch was detected for a certain portion because the difference between the two image data for that portion was larger than a threshold value, and when the die 101-2 was further compared with the die 101-3, a mismatch was detected for the same portion; in this case, it is determined that that portion of the die 101-2 contains the defect. In a like manner, comparisons are sequentially made between adjacent dies, such as between the dies 101-3 and 101-4, and so on.

As shown in FIG. 2, the peripheral circuit portion 111 is a portion containing randomly arranged patterns, but the cell portion 112 is made up of identical cell patterns repeated at a prescribed pitch. In view of this, for the inspection of the peripheral circuit portion 111, a comparison is made between adjacent dies as described above, i.e., a die-to-die comparison, but for the inspection of the cell portion 112, the image is split at the cell pattern repeat pitch P, and the inspection is performed by sequentially comparing adjacent cell patterns in accordance with the double detection. This method is called a cell-to-cell comparison.

FIG. 3B is a diagram explaining the cell-to-cell comparison method; as shown, the cell patterns are repeated at pitch P, and comparisons are sequentially made between adjacent cell patterns, such as between the cell patterns 121-1 and 121-2, then between the cell patterns 121-2 and 121-3, and so on. Compared with the die-to-die comparison, the cell-to-cell comparison, in which a comparison is made between patterns located relatively close to each other, is less susceptible to noise caused by unevenness of wafer color, image registration error, etc., and hence has the advantage of being able to achieve high detection sensitivity. It is therefore desirable that the inspection of the cell portion containing the repeated cell patterns be performed based on the cell-to-cell comparison, and that the inspection of the peripheral circuit portion be performed based on the die-to-die comparison.

FIG. 4 is a diagram showing an internal configuration for performing the die-to-die comparison inspection in a prior art image defect inspection apparatus (surface inspection machine) for semiconductor wafer inspection. As will be described later, such a configuration is generally implemented as an image processing unit using a computer. The configuration and operation for performing the die-to-die comparison inspection will be briefly described below.

The image defect inspection apparatus 1 comprises: a stage 11 movable at least in the XY plane by holding a semiconductor wafer 100 thereon; an image capturing unit 12, disposed above the stage 11, for outputting an image signal by capturing an image of the surface of the wafer 100; an analog-digital converter 13 for converting the analog image signal, output from the image capturing unit 12, into digital image data; an image processing unit 20 for detecting a defect existing on the surface of the wafer 100 by performing prescribed image processing based on the image data; and an image transferring unit 14 for receiving the image data from the analog-digital converter 13 and transferring it into the image processing unit 20.

When the image capturing unit 12 is scanned in the main scanning directions 102-1 to 102-4 as shown in FIG. 2 by moving the stage 11 thereby moving the image capturing unit 12 relative to the wafer 100, a strip-like swath image will be obtained for each main scan.

When the swath image is input via the analog-digital converter 13 and the image transferring unit 14, the image defect inspection apparatus 1 divides the swath image into small regions of a prescribed size, called the "frames." The defect detection such as the die-to-die comparison and/or cell-to-cell comparison described above is performed on a frame-by-frame basis. FIG. 5 is a diagram showing an example of how the swath image is divided into the plurality of frames.

First, the swath SW is divided into n regions in the direction orthogonal to the main scanning direction, i.e., in the longitudinal direction of the image capturing unit 12 constructed from a one-dimensional line sensor. For example, when reading out the one-dimensional image data from the image capturing unit 12, the image is divided into n regions at intervals of a predetermined number of pixels, thereby dividing the swath SW into a plurality of image data channels consisting of channel 1 to channel n.

The image data divided into the channels is further divided at intervals of a predetermined number of pixels (in the illustrated example, i pixels) in the main scanning direction. More specifically, when the pixel coordinate along the main scanning direction is designated as "line," each channel of image data in the illustrated example is divided into image blocks comprising image data from line 1 to line i, image data from line (i+1) to line (2×i), and so on.

That is, each small region, i.e., a frame that serves as the unit on which the defect detection such as the die-to-die comparison and/or cell-to-cell comparison is performed, is obtained by dividing each swath SW into N channels in the longitudinal direction of the image capturing unit 12 and further dividing each channel at intervals of i lines in the main scanning direction.

Turning back to FIG. 4, the image processing unit 20 comprises n multiprocessing units MP1 to MPn (MP4 to MPn not shown) which inspect the n image data channels respectively, and an image processing management unit (IPM) 21 which receives defect information from the multiprocessing units MP1 to MPn as information concerning the defects that the respective multiprocessing units MP1 to MPn detected from the respective image data channels by performing the inspection in parallel, and which consolidates the thus received defect information.

In the following description, when collectively referring to the n multiprocessing units MP1 to MPn, the designation "MPx" referring to the xth multiprocessing unit may be used to generally represent them.

The n multiprocessing units MP1 to MPn are identical in configuration. Each multiprocessing unit comprises m processing units. In the illustrated example, the multiprocessing unit MP1 comprises processing units PU11 to PU1m (PU14 to PU1m not shown).

In the following description, the m processing units provided in the xth multiprocessing unit MPx are designated as "PUx1" to "PUxm", respectively; when collectively referring to the m processing units PUx1 to PUxm, the designation "PUxy" referring to the yth processing unit may be used to generally represent them.

In each multiprocessing unit MPx, each channel of input image data is divided into frames, and the defect detection is performed on a frame-by-frame basis. Each multiprocessing unit MPx comprises m processing units PUx1 to PUxm that can operate in parallel. With these m processing units PUx1 to PUxm operating in parallel to detect defects in the respectively different frames, the multiprocessing unit MPx simultaneously processes m frames in parallel.

Each of the processing units PUx1 to PUxm, upon detecting a defect, creates defect information for each detected defect and outputs the defect information.

The defect information output in parallel from the respective processing units PUx1 to PUxm is consolidated into a set of defect information by a processor unit PUx provided in each multiprocessing unit MPx, and sent to the IPM 21.

The suffix "x" in the processor unit PUx indicates that the processor unit PUx is provided in the xth multiprocessing unit MPx; for example, in FIG. 4, the processor unit PU1 provided in the first multiprocessing unit MP1 is shown. The processor unit PUx may be implemented using, for example, a single board computer (SBC) which is a computing means implemented on a single board.

The processing units PU11 to PUnm are also identical in configuration. Taking the processing unit PU11 shown in FIG. 4 as a representative example, the processing unit PU11 comprises a processor element PE11, a memory M11, and a line counter LC11 to be described later.

In the memory M11, there are allocated an area for storing the frame image on which the processing unit PU11 performs defect detection and an area for storing the defect information for the defect detected as a result of the defect detection. For convenience, in the following description, the frame image storing area and the defect information storing area allocated in the memory M11 are referred to as the image memory IM11 and the defect information memory DM11, respectively.

The processor element, line counter, memory, image memory, and defect information memory provided in the yth processing unit PUxy within the xth multiprocessing unit MPx are respectively referred to as the processor element PExy, the line counter LCxy, the memory Mxy, the image memory IMxy, and the defect information memory DMxy.

Each processing unit PUxy selects, from the image data corresponding to the channel input to the multiprocessing unit MPx, the frame (inspection frame) to be inspected for defects and stores the selected frame in the image memory IMxy.

For this purpose, the processor unit PUx specifies the range of lines that covers the inspection frame to be inspected by the processing unit PUxy.

As the image capturing unit 12 is scanned by moving the stage 11, the position of the stage 11 is measured by a stage position measuring unit 50. Based on the position information of the stage 11 thus measured, a die switch signal generating unit 51 generates a die switch signal that indicates whether the image capturing unit 12 is currently scanning an inspection region (for example, a chip region) on the wafer 100 or scanning a non-inspection region (for example, an inter-chip region).

The line counter LCxy provided in each processing unit PUxy counts the number of lines of the image data so far received since the die switch signal began to indicate "CURRENTLY SCANNING THE INSPECTION REGION." The processor element PExy determines whether the number of lines counted (i.e., the line of the image data currently being received) falls within the range of lines specified by the processor unit PUx; if it falls within the specified range, the processor element PExy determines that the image data currently being received corresponds to the inspection frame, and stores the data in the image memory IMxy.

The m frames generated as the image capturing unit 12 scans across the wafer 100 are sequentially input into the processing units PUx1, PUx2, PUx3, . . . , PUxy in this order, after which the subsequently generated frames are sequentially input into the processing units PUx1, etc. in like manner, repeating the same process.

When the inspection frame is stored in the image memory IMxy, the processor element PExy registers the inspection frame with the reference frame against which the inspection frame is to be compared in the subsequent defect detection process.

Here, the number of lines, i, forming each frame is predetermined based on the repeat pitch of the dies or cells on the wafer 100 so that the frames containing patterns that should normally be identical to each other are cyclically input to the same processing unit PUxy.

The frame input to the processing unit PUxy in the immediately preceding cycle is used as the reference frame for the frame input in the current cycle. Alternatively, the frame input in the current cycle is used as the reference frame, and the frame input in the immediately preceding cycle is used as the inspection frame.

The processor element PExy performs the defect detection on the inspection frame. That is, the processor element PExy compares the gray level values of corresponding pixels between the two frames, and if there is a portion where the gray level difference is larger than a threshold value, that portion is detected as containing a defect.

Then, defect information of a prescribed format, indicting the detected position of the defect, the size of the defect, etc., is created for each detected defect, and sent to the processor unit PUx. The processor unit PUx receives the defect information in parallel from the processor element PEx1 to PExm provided in the respective processing units PUx1 to PUxm, and consolidates the defect information into a set of defect information which is then sent to the image processing management unit 21.

The defect information created by the processor element PEx1 to PExm may include defect information created based on a false defect, not a true defect. Accordingly, the processor unit PUx reexamines the defect information received from the respective processor element PEx1 to PExm and determines whether the defect information represents a true defect or a false defect.

FIG. 6 is a time chart showing the conventional operation of the component elements of the multiprocessing unit MPx. The time chart of FIG. 6 shows that when the image capturing unit 12 scans the surface of the wafer 100, the regions on the surface of the wafer 100 to be inspected by the respective processor elements PEx1, PEx2, PEx3, . . . , PExm are scanned by the image capturing unit 12 during the time periods of t1 to t2, t2 to t3, t3 to t4, . . . , t5 to t6, respectively.

During the time period of t1 to t2 when the image capturing unit 12 scans the region on the surface of the wafer 100 to be inspected by the processor element PEx1, the processor element PEx1 acquires the frame corresponding to that region from the image capturing unit 12 and stores the frame in the image memory IM1. Then, after performing "preprocessing" such as the registration between the inspection frame and the reference frame, defect information is generated by performing the defect detection. After that, at time t11, the processor element PEx1 transfers the thus generated defect information to the processor unit PUx together with analysis data necessary for reexamining the defect.

Thereafter, during the time periods of t2 to t3, t3 to t4, . . . , t5 to t6 when the image capturing unit 12 scans the regions on the surface of the wafer 100 to be inspected by the respective processor elements PEx2, PEx3, . . . , PExm, the respective processor elements PEx2, PEx3, . . . , PExm, like the processor element PEx1, acquire the frames corresponding to the respective regions, perform the preprocessing, perform the defect detection, and transfer the defect information and the analysis data to the processor unit PUx.

For the processing unit PUx to reexamine the defect information, not only the defect information indicating the result of the defect detection performed by the processor element PExy, but also the original image from which the defect was detected is needed. Accordingly, the processor element PExy transfers the defect information to the processing unit PUx together with sub-images showing the defect and its surrounding areas segmented from the inspection frame and the reference frame, respectively, as the analysis data. FIG. 7 is a diagram showing by way of example the sub-images segmented as the analysis data from the inspection frame and the reference frame, respectively.

The analysis data that the processor unit PUx uses for reexamination includes sub-image data PId which represents a region of width Wd and length Ld centered around the defect position Pd (x,y) of the defective portion D in the swath image SW and segmented from the inspection frame Fi from which the processor element PExy detected the defect.

The analysis data further includes sub-image data PIr which represents a region corresponding to the position of the sub-image data PId in the inspection frame Fi and segmented from the reference frame Fr against which the inspection frame Fi was compared for the detection of the defect.

When the defect information and the analysis data are received from the processor element PEx1 at time t11, the processor unit PUx reexamines the defect information using the analysis data and determines whether the defect is a true defect or a false defect.

Then, only for the defect verified as being a true defect, "feature amount extraction" is performed to extract feature amounts, such as the size and average gray level of the defect, the average gray level difference between the inspection image and the reference image, etc., and the defect information is classified according to the extracted feature amounts.

Thereafter, when the defect information and the analysis data are received from the processor elements PEx2 and PEx3 at times t2 and t13, respectively, the processor unit PUx reexamines the defect information, extracts the feature amounts of the defects, and classifies the defects, in the same manner as when the defect information and the analysis data are received from the processor element PEx1.

Then, after time t6, the regions to be inspected for defects by the respective processor elements PEx1, PEx2, PEx3, . . . , PExm are scanned by the image capturing unit 12 in the same manner as described above, repeating the same process.

As described above, in the prior art image defect inspection apparatus, the plurality of processor elements PExy perform the defect detection in parallel, and transfer the defect information of the detected defects to the processor unit PUx which consolidates the defect information into a set of defect information; in this case, reexamination of the defect information is performed on the processor unit PUx side. As a result, the amount of data to be transferred from the processor elements PExy to the processor unit PUx becomes excessively large for the following reasons.

First, since the defects detected by the plurality of processor elements PExy include false defects, the defect information that the processor elements PExy transfer to the processor unit PUx includes false defect information which otherwise need not be transferred.

Second, since the reexamination of the defect is performed on the processor unit PUx side, analysis image data has to be transferred from each processor element PExy, increasing the amount of data to be transferred for each defect.

In this way, in the prior art image defect inspection apparatus, since the amount of data transferred to the processor unit PUx is large, the processing capacity of the processor unit PUx becomes a bottleneck, limiting the number of defects that can be detected by each processor element PExy and thus preventing the defect detection sensitivity from being increased. As a result, there arises the possibility that a true defect may not be detected as a defect candidate in the defect detection performed by each processor element PExy.

SUMMARY OF THE INVENTION

In view of the above problem, it is an object of the present invention to resolve the bottleneck associated with the processor unit by reducing the amount of information to be transferred from each processor element PExy to the processor unit PUx.

To achieve the above object, the present invention provides an image defect inspection apparatus in which an image captured of the surface of a sample is divided into small regions, defect detection is performed on the respective regions in parallel by using a plurality of processor elements, and defect information of the defects thus detected in parallel is consolidated by a designated processor unit into a set of defect information, wherein the defect detection and the reexamination of the detected defect are performed in the same processor element that detected the defect.

In this configuration, since the amount of defect information that the processor elements transfer to the processor unit can be reduced by reducing the possibility of generating false defect information, the bottleneck limiting the amount of data to be transferred from each processor element to the processor unit becomes less likely to develop. Furthermore, since there is no need to transfer the image data for reexamination from each processor element to the processor element as in the prior art, the bottleneck limiting the amount of data to be transferred from each processor element to the processor unit can be substantially resolved.

More specifically, according to the present invention, there is provided an image defect inspection apparatus which performs a defect detection for detecting a defect on a surface of a sample by comparing corresponding portions in an image captured of the surface of the sample that are supposed to be identical to each other, and a reexamination for reexamining a site at which the defect was detected in the captured image, comprising: a plurality of processor elements which perform the defect detection in parallel on regions created by dividing the captured image; and a processor unit which receives defect information in parallel from the plurality of processor elements as information concerning individual defects detected by the processor elements, and which outputs the defect information as a set of defect information, wherein each individual one of the processor elements performs the reexamination on the defect detected through the defect detection performed by the individual processor element, before sending the defect to the processor unit.

According to the present invention, there is also provided an image defect inspection apparatus which performs a defect detection for detecting a defect on a surface of a sample by comparing corresponding portions in an image captured of the surface of the sample that are supposed to be identical to each other, and a reexamination for reexamining the defect to determine whether the defect is a true defect or a false defect, comprising: a plurality of processor elements which perform the defect detection in parallel on regions created by dividing the captured image; and a processor unit which receives defect information in parallel from the plurality of processor elements as information concerning individual defects detected by the processor elements, and which outputs the defect information as a set of defect information, wherein each individual one of the processor elements performs the reexamination to determine whether the defect detected through the defect detection performed by the individual processor element is a true defect or a false defect, and sends the defect to the processor unit only when the defect is verified as being a true defect.

BRIEF DESCRIPTION OF THE DRAWINGS

The present invention will be more clearly understood from the description as set forth below with reference to the accompanying drawings, wherein:

FIG. 11 is a time chart showing the operation of component elements in each multiprocessing unit in the image defect inspection apparatus according to the embodiment of the present invention.

DESCRIPTION OF THE PREFERRED EMBODIMENTS

Figure 1:
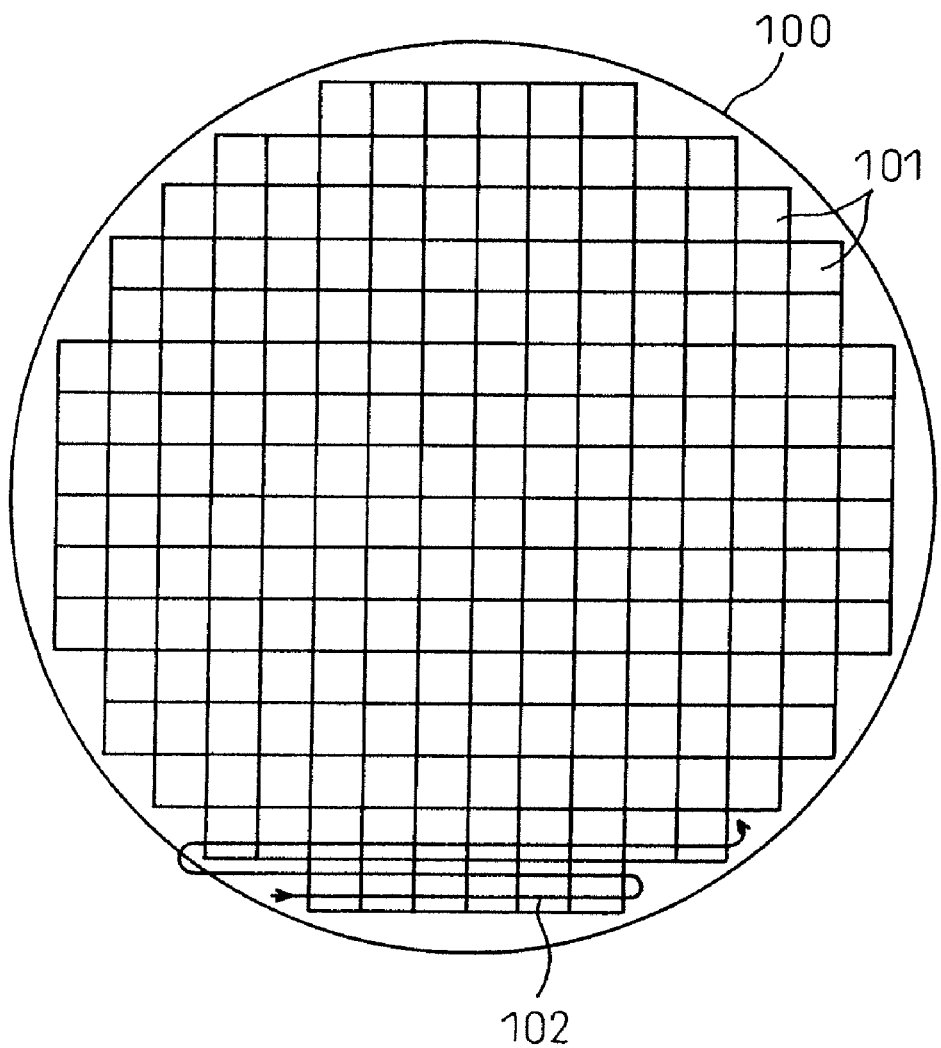
FIG. 1 is a diagram showing an example of a scan path for capturing for inspection the patterns of chips (dies) formed on a semiconductor wafer.
Figure 2:
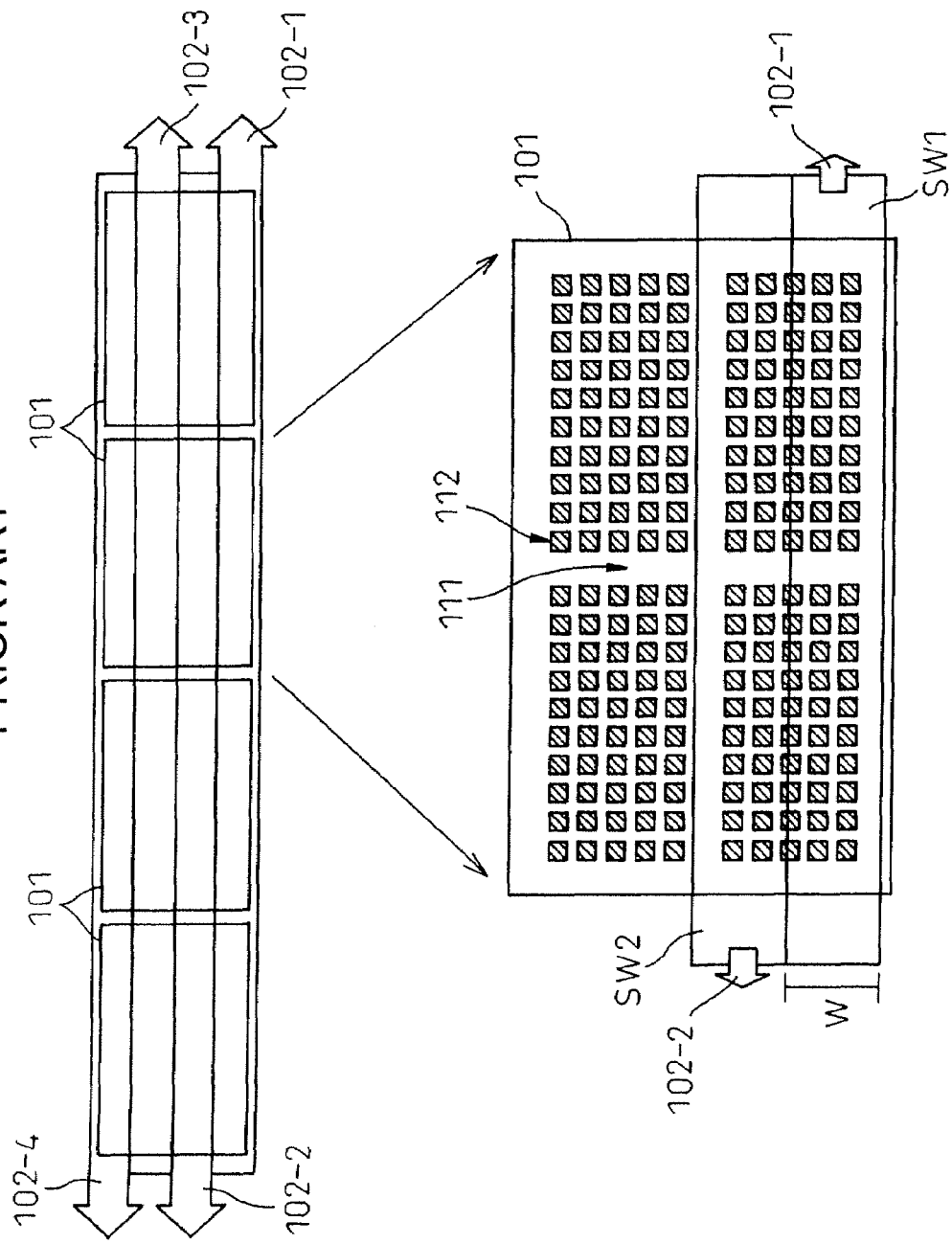
FIG. 2 is a diagram showing in further detail how the dies on the wafer is scanned.
Figure 3A:
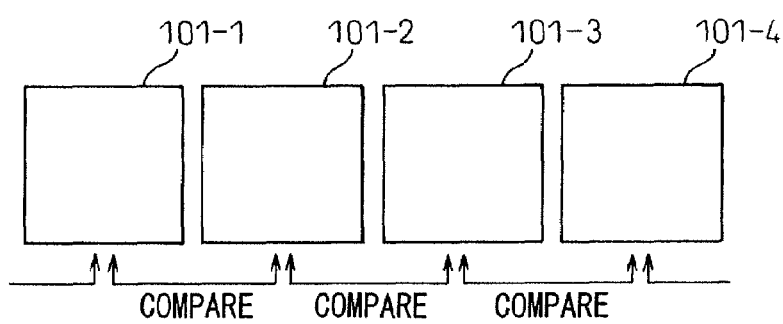
FIG. 3A is a diagram explaining a die-to-die comparison.
Figure 3B:
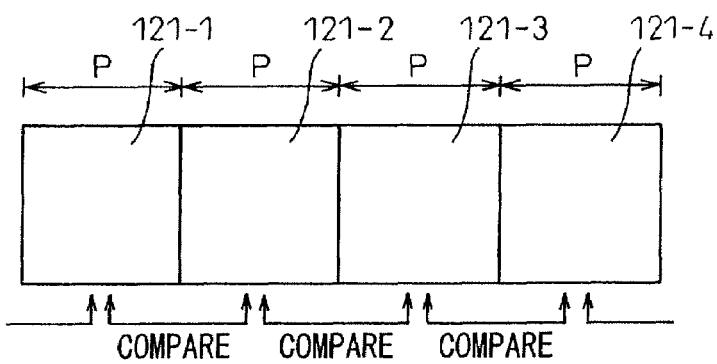
FIG. 3B is a diagram explaining a cell-to-cell comparison.
Figure 4:
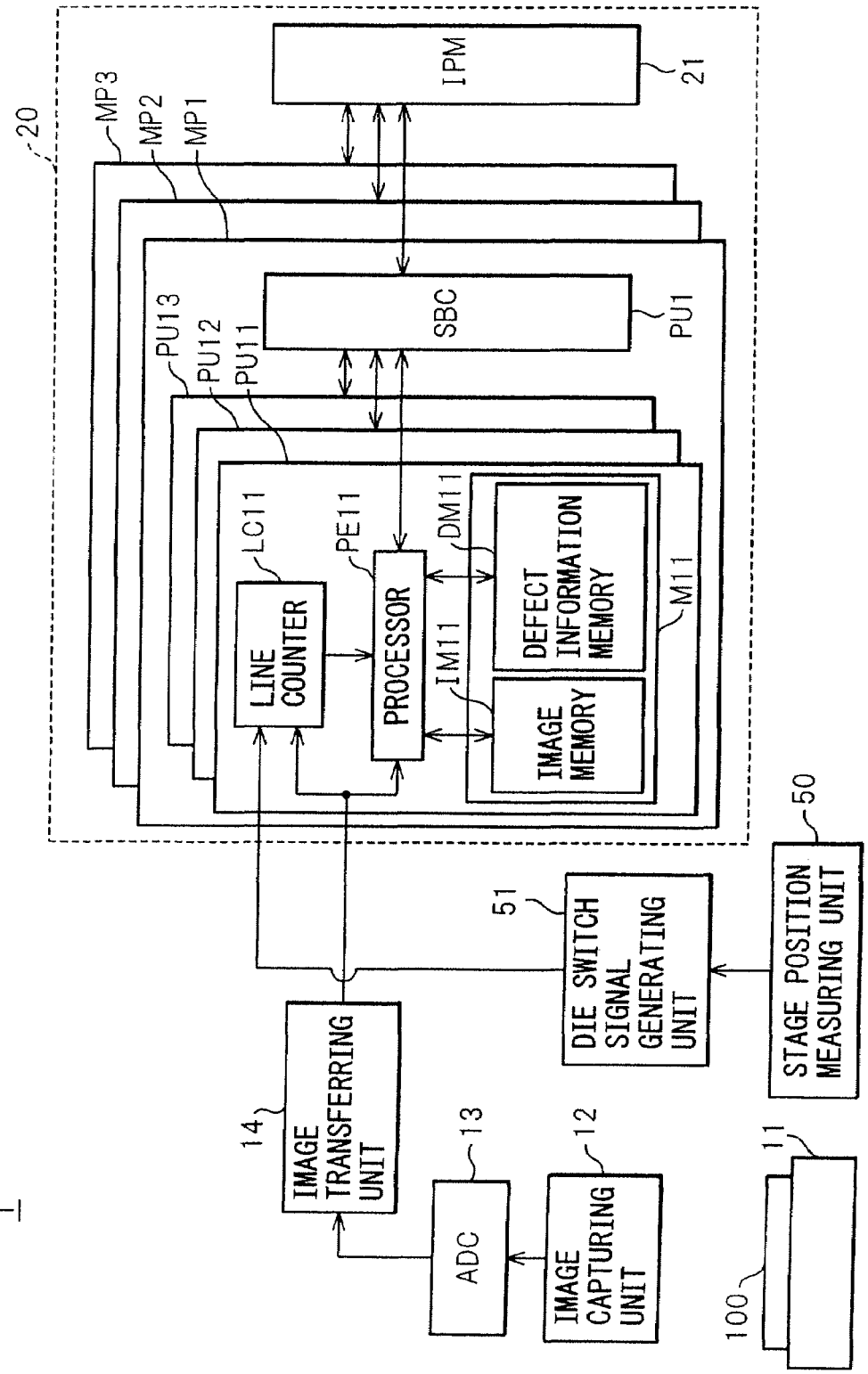
FIG. 4 is a diagram showing the internal configuration of a prior art image defect inspection apparatus for semiconductor wafer inspection.
Figure 5:
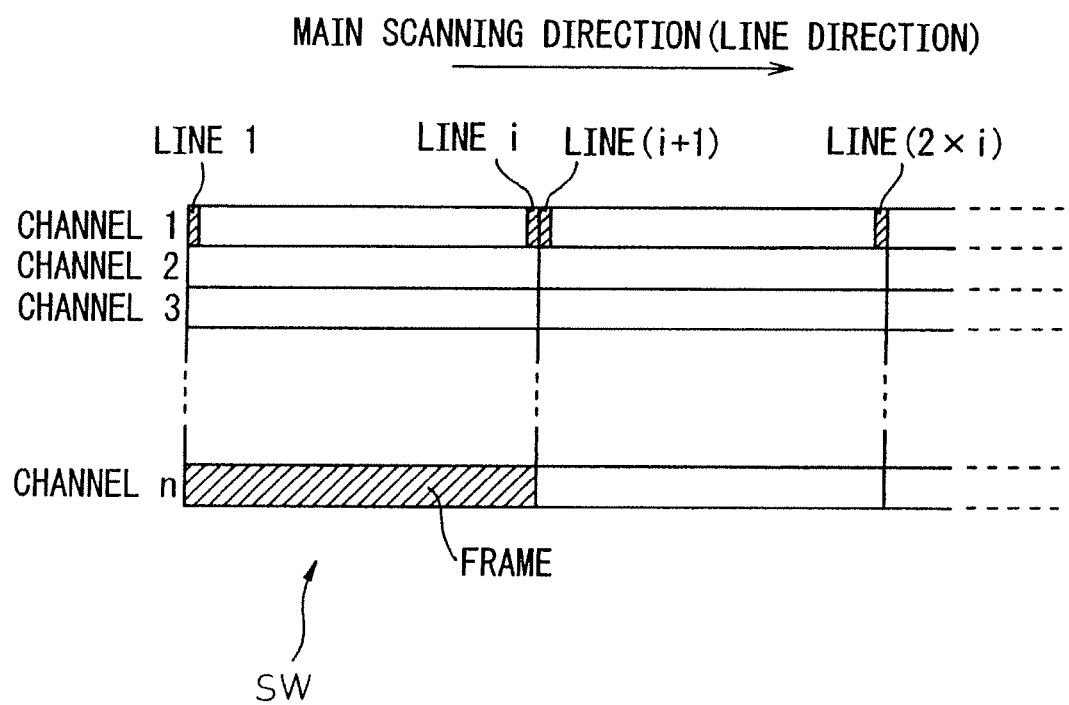
FIG. 5 is a diagram showing an example of how a swath image is divided into a plurality of frames.

The preferred embodiments of the present invention will be described in detail below while referring to the attached figures. The configuration of the image defect inspection apparatus according to the embodiment of the present invention is essentially the same as that of the image defect inspection apparatus 1 shown in FIG. 4, and therefore, the same component elements as those in FIG. 4 are designated by the same reference numerals and will not be further described herein; it will also be understood that the same component elements have the same functions, unless specifically stated otherwise.

Figure 8:
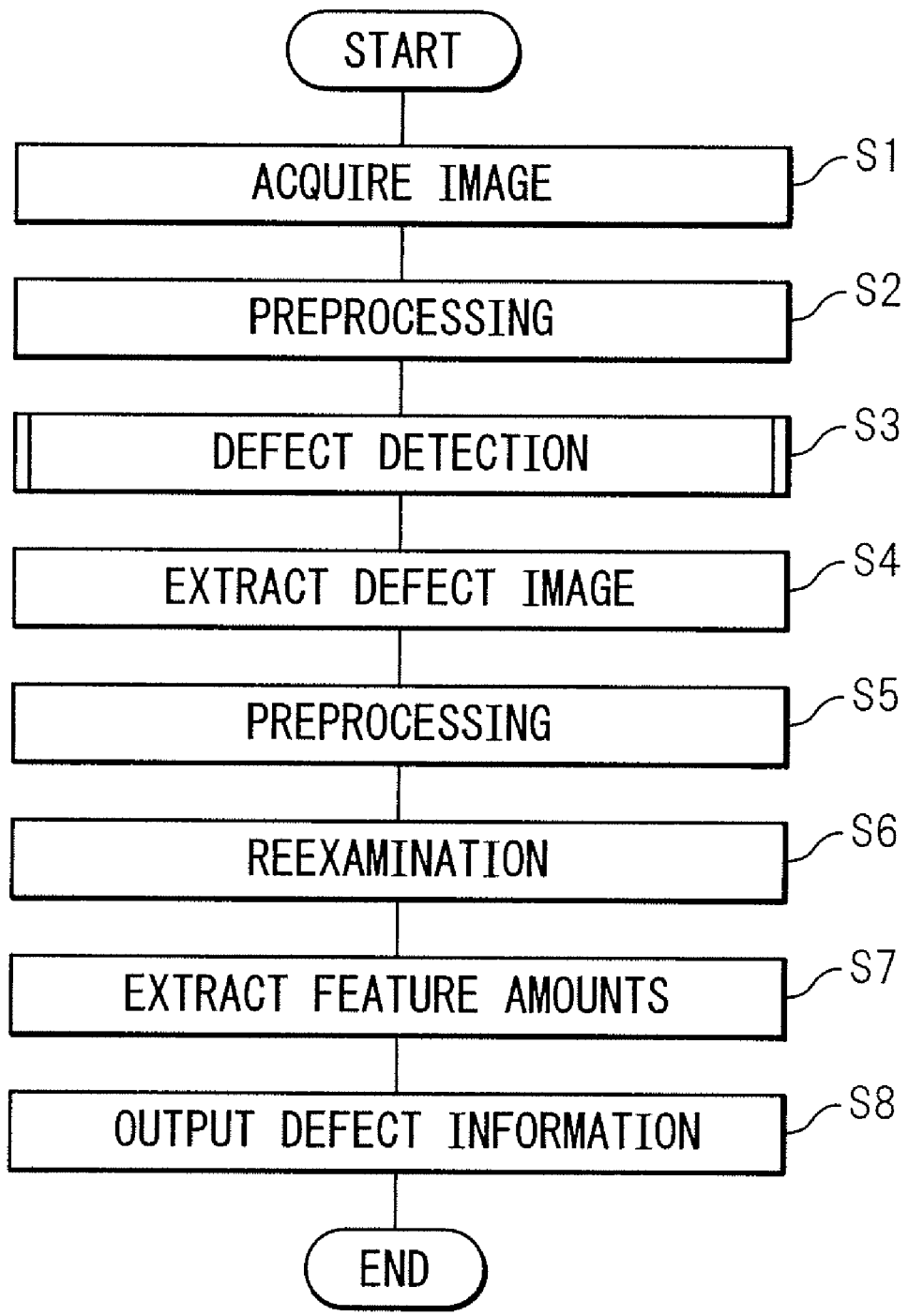
FIG. 8 is a flowchart illustrating the operation of each processor element according to an embodiment of the present invention.

In the image defect inspection apparatus 1 according to the embodiment of the present invention, the defect reexamination and the feature amount extraction of a defect, which in the prior art were performed by the processor unit PUx, are performed by each processor element PExy, which detects the defect. FIG. 8 is a flowchart illustrating the operation of each processor element PExy according to the embodiment of the present invention.

In step S1, when the region on the surface of the wafer 100 to be inspected by the processor element PExy is scanned by the image capturing unit 12, the processor element PExy acquires the frame corresponding to that region from the image capturing unit 12 and stores the frame in the image memory IMxy.

In step 2, the processor element PExy performs preprocessing required for the defect detection on the frame stored in the image memory IMxy. The preprocessing here includes, for example, achieving registration between the inspection frame stored in the image memory IMxy and the reference frame with which the inspection frame is to be compared. The registration is performed, for example, by moving either one of the frames so as to minimize the difference between a given portion within the inspection frame and the corresponding portion within the reference frame.

Figure 9:
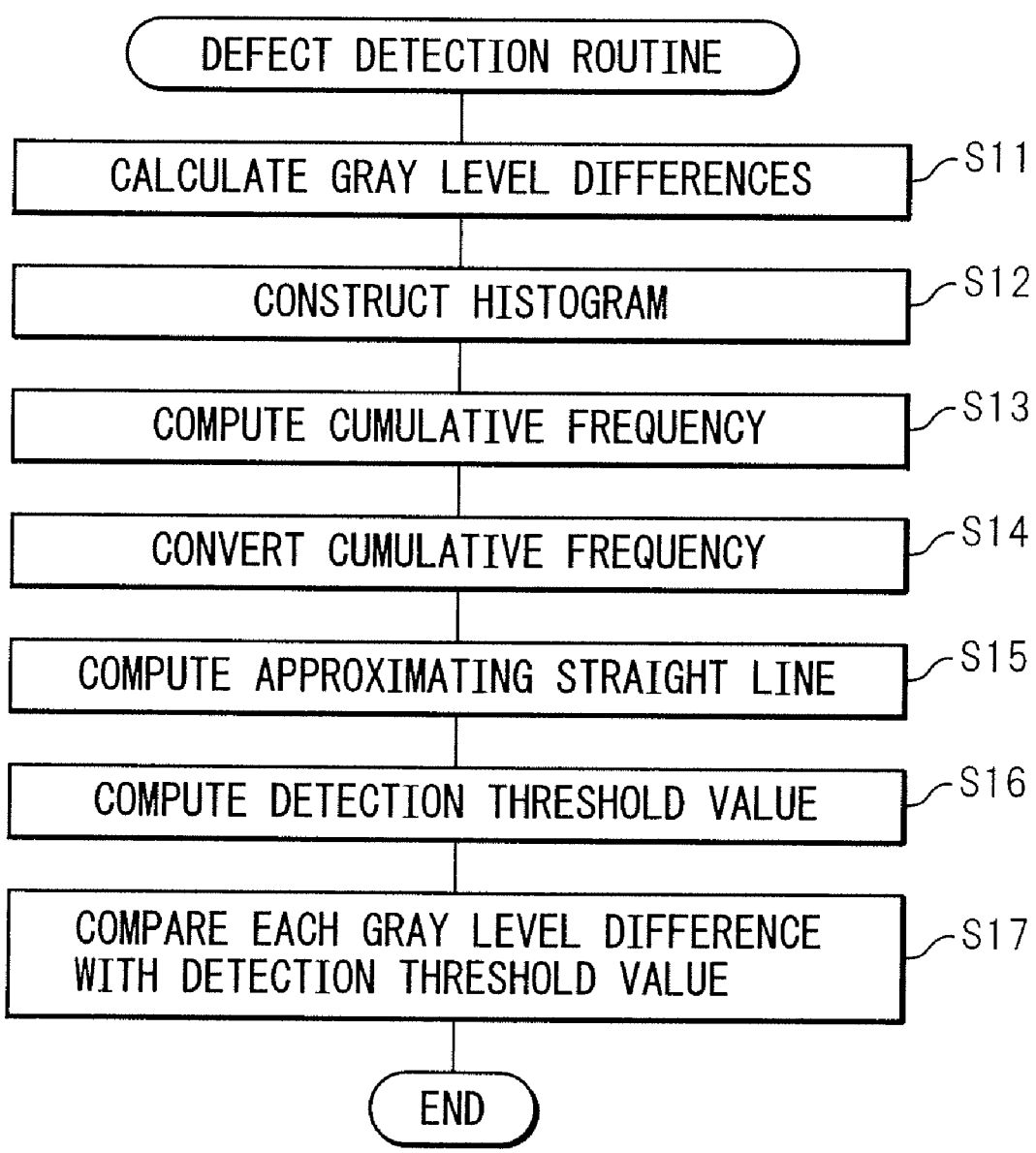
FIG. 9 is a flowchart illustrating a defect detection subroutine shown in FIG. 8.

In step S3, the processor element PExy compares the inspection frame with the reference frame and, if there is a portion differing between them, then detects that portion as being a defect. FIG. 9 is a flowchart illustrating the defect detection subroutine shown in FIG. 8, and FIGS. 10A to 10C are diagrams for explaining the defect detection subroutine illustrated in FIG. 9.

Figure 10A:
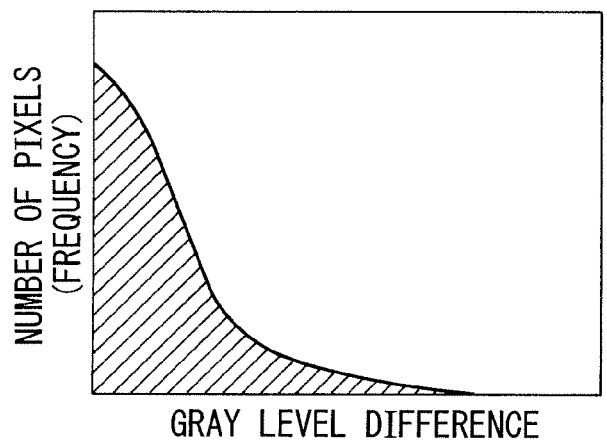
FIGS. 10A to 10C are diagrams for explaining the defect detection subroutine illustrated in FIG. 9.

In step S11, the processor element PExy calculates the gray level difference between each pixel in the inspection frame and the corresponding pixel in the reference frame, and generates a difference image representing the difference between these frames. In step S12, a histogram of the gray level differences of the pixels is constructed as shown in FIG. 10A. Here, if the number of pixels to be inspected is large, the histogram need not be constructed by using the gray level differences of all the pixels, but can be constructed by using the gray level differences only of selectively sampled pixels. Then, in step S13, the cumulative frequency of the gray level difference is computed from the histogram.

Figure 10B:
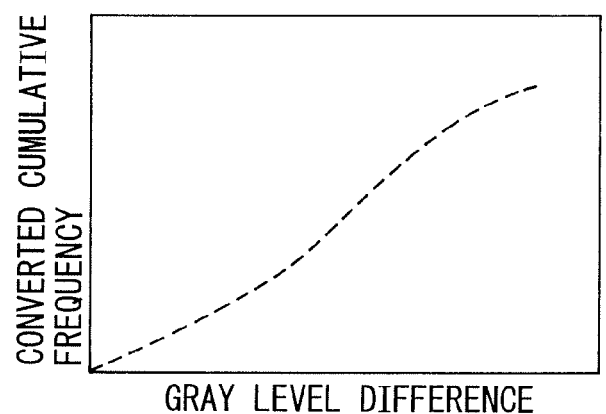

In step S14, assuming that the gray level difference obeys a certain type of distribution, the cumulative frequency computed in step S13 is converted so that the cumulative frequency shows a linear relationship with respect to the gray level difference. Here, the cumulative frequency is converted by assuming that the gray level difference obeys a certain type of distribution such as a normal distribution, a Poisson distribution, or a chi-squared distribution. The thus converted cumulative frequency is shown in FIG. 10B.

Figure 10C:
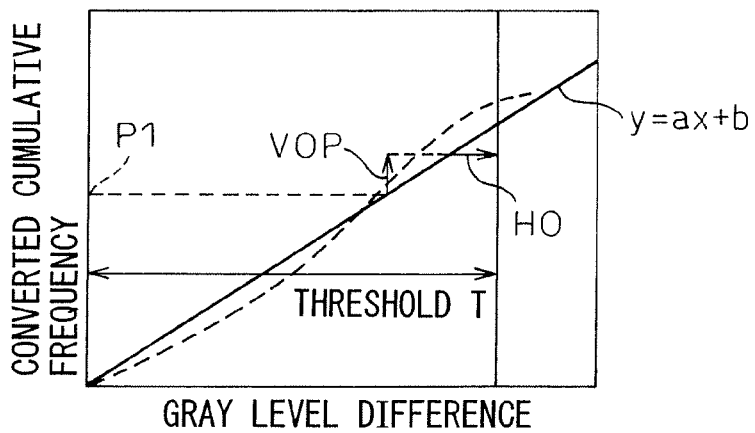

In step S15, an approximating straight line (y=ax+b) representing the relationship between the gray level difference and the converted cumulative frequency is derived in accordance with the cumulative frequency converted in step S14 (see FIG. 10C).

In step S16, the detection threshold value is determined based on the parameters "a" and "b" of the approximating straight line and on sensitivity setting parameters (fixed values). Here, VOP and HO are set as the fixed sensitivity setting parameters for the approximating straight line representing the relationship between the gray level difference and the converted cumulative frequency, and the point on the straight line is obtained that represents the cumulative frequency P1 corresponding to a certain cumulative probability (p) (P1 is obtained by multiplying p by the number of samples); then, the gray level difference obtained by moving that point by VOP in the vertical axis direction and by HO in the horizontal axis direction is taken as the threshold value. Accordingly, the detection threshold value T is calculated by the following equation $$T=(P1+b+VOP)/(a+HO) \quad (1)$$

In this way, the detection threshold value can be suitably determined in accordance with the histogram of the gray level differences of the image under inspection.

In step S17, the gray level differences calculated pixel by pixel between the inspection frame and the reference frame are each compared with the thus computed detection threshold value T, and any pixel portion where the gray level difference exceeds the detection threshold value T is detected as a defect; then, defect information of a prescribed format, containing such information as the detected position, is created for the detected defect.

Figure 7:
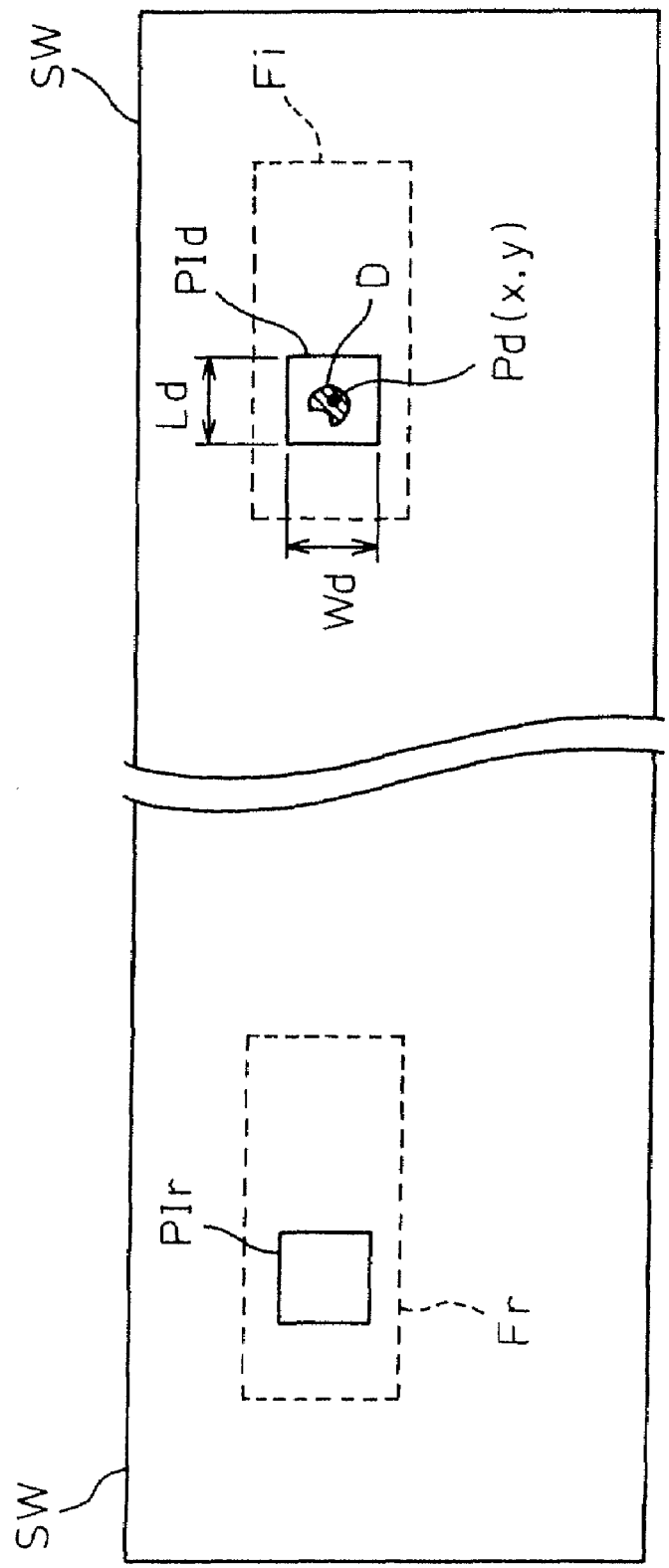
FIG. 7 is a diagram showing, by way of example, sub-images segmented as analysis data from an inspection frame and a reference frame, respectively.

Turning back to FIG. 8, in step S4, the processor element PExy extracts from both the inspection frame and the reference frame the image data necessary for reexamining the defect detected in step S3. Here, as described, for example, with reference to FIG. 7, the sub-image PId segmented from the inspection frame Fi and the sub-image PIr segmented from the reference frame Fr may be used as the extracted image data.

In step S5, the processor element PExy performs preprocessing preparatory to the subsequent reexamination step (S6). The preprocessing here includes, for example, achieving registration between the sub-images PId and PIr extracted in step S4. The registration is performed, for example, by moving either one of the patterns so as to minimize the difference between a given portion within the sub-image PId and the corresponding portion within the sub-image PIr.

In the preprocessing performed in step S2 prior to the defect detection in step S3, the registration has been performed on a frame-by-frame basis; on the other hand, in step S5, since the registration is performed based on a much smaller sub-image extracted from the area surrounding the defect, more precise registration can be achieved for the defect portion, serving to reduce the possibility of a false defect occurring due to misregistration between the images under comparison.

In step S6, the processor element PExy compares the sub-images PId and PIr thus registered relative to each other in step S5 and examines the defect detected in step S3 to determine whether the defect is a true defect or a false defect.

In this case, the processor element PExy calculates, for example, the gray level difference between the sub-images PId and PIr on a pixel-by-pixel basis, and determines whether the defect is a true defect or a false defect, based on whether or not the number of pixels found to have a gray level difference larger than a predetermined detection threshold value exceeds a predetermined lower limit value.

The detection threshold value used in the above reexamination step is determined based on the distribution of the gray level differences between the corresponding pixels of the sub-images PId and PIr, in a manner similar to that shown in steps S12 to S16 in FIG. 9. Accordingly, compared with the detection threshold value determined on a frame-by-frame basis in the defect detection in step S3, the detection threshold value used here better matches the distribution of the gray level differences in the defect detected portion, and the determination as to whether the detected defect is a true defect or not can be made with higher accuracy.

Then, in step S7, only for the defect verified as being a true defect in step S6, the processor element PExy extracts feature amounts, such as the size and average gray level of the defect, the average gray level difference between the inspection image and the reference image, etc.

In step S8, only for the defect verified as being a true defect in step S6, the processor element PExy adds the feature amount information generated in step S7 to the defect information generated in step S3, and supplies them to the processor unit PUx.

Figure 6:
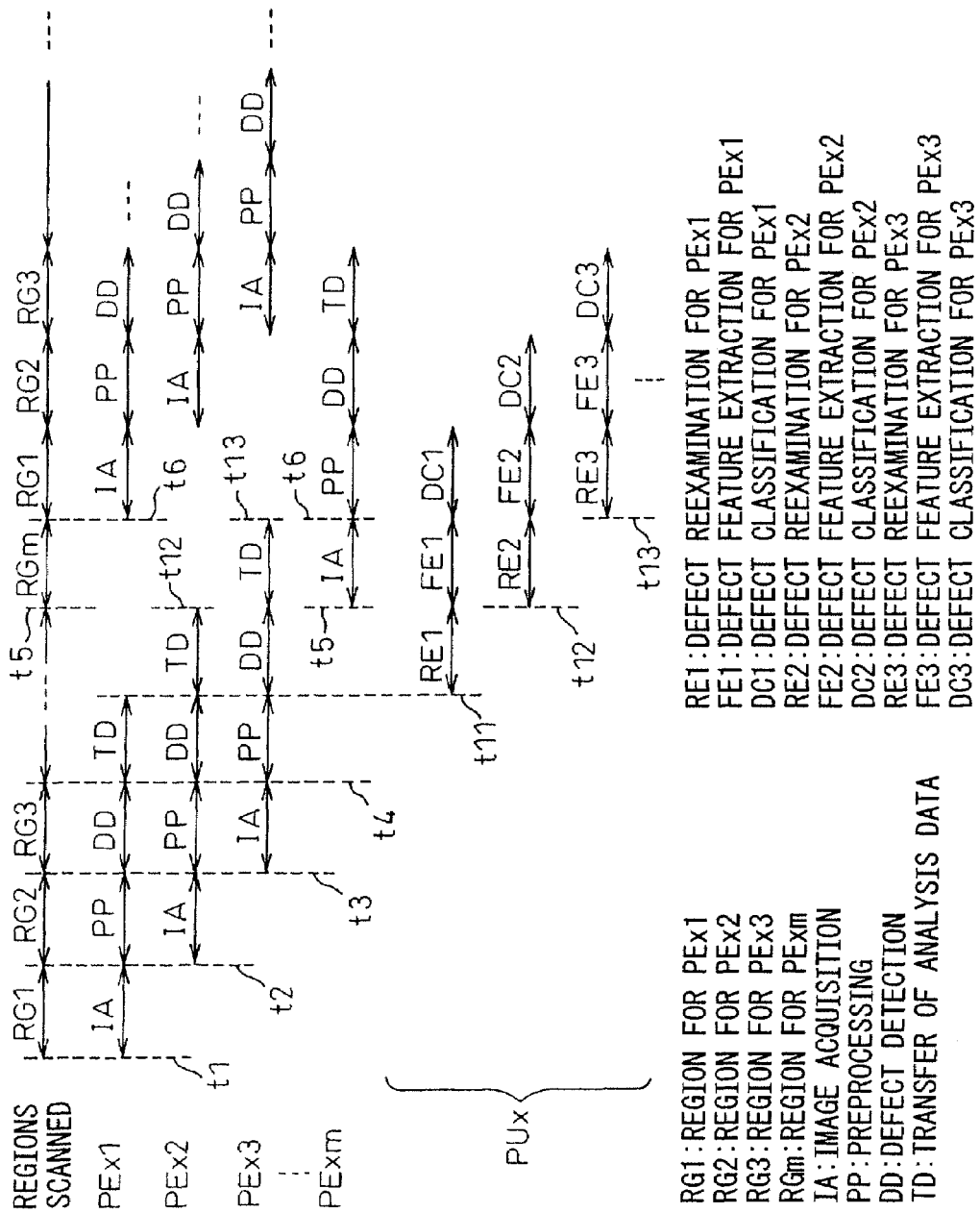
FIG. 6 is a time chart showing the conventional operation of component elements in each multiprocessing unit shown in FIG. 4.

FIG. 11 is a time chart showing the operation of the component elements of each multiprocessing unit MPx in the image defect inspection apparatus according to the embodiment of the present invention. As in the conventional time chart shown in FIG. 6, the time chart here shows that when the image capturing unit 12 scans the surface of the wafer 100, the regions on the surface of the wafer 100 to be inspected by the respective processor elements PEx1, PEx2, PEx3, ..., PExm are scanned by the image capturing unit 12 during the time periods of t1 to t2, t2 to t3, t3 to t4, ..., t5 to t6, respectively.

During the time period of t1 to t2 when the image capturing unit 12 scans the region on the surface of the wafer 100 to be inspected by the processor element PEx1, the processor element PEx1, as shown in the flowchart of FIG. 8, acquires the frame corresponding to that region from the image capturing unit 12 (step S1), performs the preprocessing (step S2), and generates the defect information by performing the defect inspection (step S3).

After that, the processor element PEx1 reexamines the defect it has detected (step S6), performs the image extraction (step S4) and preprocessing (step S5) preparatory to the reexamination step, performs the feature amount extraction (step S7), and supplies the defect information containing the feature amount information to the processor unit PUx.

Thereafter, during the time periods of t2 to t3, t3 to t4, ... , t5 to t6 when the image capturing unit 12 scans the regions on the surface of the wafer 100 to be inspected by the respective processor elements PEx2, PEx3, ..., PExm, the respective processor elements PEx2, PEx3, ..., PExm, like the processor element PEx1, acquire the frames corresponding to the respective regions, perform the preprocessing step, the defect detection step, the image extraction step, the preprocessing step, the reexamination step, and the feature amount extraction step in this order, and transfer the defect information to the processor unit PUx.

At times t11, t12, t12, ..., t14, the processor unit PUx receives the defect information from the processor elements PEx1, PEx2, PEx3, ..., PExm, respectively. Compared with the prior art, the amount of the defect information is greatly reduced, because the possibility of generating false defect information is reduced and because image data for reexamination need not be included.

The processor unit PUx that received the defect information from the respective processor elements PEx1 to PExm classifies the defect information using a relatively simple classification method called RDC (Real-time Defect Classification), adds the information showing the result of the classification to the defect information, and supplies the resulting defect information as a set of defect information to the image processing management unit 21.

According to the present invention, the amount of data to be transferred to the processor unit PUx is reduced, thus resolving the bottleneck associated with the processing capacity of the processor unit PUx. Since this enables the processor element PExy to detect defect candidates by increasing the detection sensitivity, the possibility of failing to detect true defects can be effectively reduced.

The present invention is applicable to an image defect inspection apparatus for detecting a defect on the surface of a sample based on an image captured of the surface of the sample. More particularly, the invention is applicable to an image defect inspection apparatus which acquires a plurality of patterns by scanning a sample under inspection, such as a semiconductor wafer, a photomask substrate, a liquid crystal display panel substrate, or a liquid crystal device substrate, on which a plurality of patterns that should be identical to each other are formed in an orderly repeating fashion, and which compares the corresponding portions of the patterns.

While the invention has been described with reference to specific embodiments chosen for purpose of illustration, it should be apparent that numerous modifications could be made thereto by those skilled in the art without departing from the basic concept and scope of the invention.

What is claimed is:

1. An image defect inspection apparatus for detecting a defect on a surface of a sample by comparing corresponding portions in a captured image of the surface of said sample comprising:
    a plurality of processor elements configured to perform said defect detection in parallel on regions created by dividing said captured image, each of the plurality of processor elements is configured to be capable of reexamining a region at which a defect is detected by a respective processor element, in said captured image; and
    a processor unit configured to receive information in parallel from said plurality of processor elements concerning a respective defect detected and reexamined by each said processor elements, and to output defect information as a set of defect information, wherein
    each individual one of said processor elements is further configured to perform said reexamination on a defect detected by said individual processor element, before sending said information concerning the defect detected by said individual processor element to said processor unit.

2. An image defect inspection apparatus as claimed in claim 1, wherein each of said processor elements is configured to perform feature amount extraction for extracting an amount of a prescribed feature of said defect after said reexamination.

3. An image defect inspection apparatus for detecting a defect on a surface of a sample by comparing corresponding portions in a captured image of the surface of said sample comprising:
    a plurality of processor elements configured to perform said defect detection in parallel on regions created by dividing said captured image, each of the plurality of processor elements is configured to be capable of determining whether a defect detected is a true defect or a false defect; and
    a processor unit configured to receive information in parallel from said plurality of processor elements concerning a respective defect detected and determined as being a true defect by each said processor elements, and to output defect information as a set of defect information, wherein
    each individual one of said processor elements is further configured to determine whether a defect detected by said individual processor element is a true defect or a false defect, and to send said information concerning the defect detected by said individual processor element to said processor unit only when said detected defect is determined as being a true defect.

4. An image defect inspection apparatus as claimed in claim 3, wherein each of said processor elements is configured to perform feature amount extraction for extracting an amount of a prescribed feature of said defect after said determination.

5. An image defect inspection apparatus as claimed in claim 4, wherein each of said processor elements is configured to perform said feature amount extraction only on said defect verified as being a true defect.

6. A method for detecting a defect on a surface of a sample by comparing corresponding portions in a captured image of the surface of said sample, the method comprising:

dividing said captured image into different regions;

performing defect detection in parallel on each of the different regions by a plurality of processor elements;

verifying whether a defect detected in a region is a true defect or a false defect by a respective processor element;

sending information about the defect detected to a processor unit, only when said detected defect is verified as being a true defect; and outputting defect information received by the processor unit as a set of defect information.

7. The method of claim 6, further comprising performing feature amount extraction for extracting an amount of a prescribed feature of said defect.

* * * * *